US011289159B2

(12) United States Patent
Longnos et al.

(10) Patent No.: US 11,289,159 B2
(45) Date of Patent: Mar. 29, 2022

(54) MEMORY DEVICE AND METHOD FOR WRITING DATA

(71) Applicant: HUAWEI TECHNOLOGIES CO., LTD., Guangdong (CN)

(72) Inventors: Florian Longnos, Hangzhou (CN); Engin Ipek, Rochester, NY (US); Shihai Xiao, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 156 days.

(21) Appl. No.: 16/720,406

(22) Filed: Dec. 19, 2019

(65) Prior Publication Data

US 2020/0126618 A1 Apr. 23, 2020

Related U.S. Application Data

(63) Continuation of application No. PCT/CN2017/089871, filed on Jun. 23, 2017.

(51) Int. Cl.
*G11C 13/00* (2006.01)
*G11C 11/16* (2006.01)

(52) U.S. Cl.
CPC ...... *G11C 13/0069* (2013.01); *G11C 11/1659* (2013.01); *G11C 11/1675* (2013.01);
(Continued)

(58) Field of Classification Search
CPC ............ G11C 13/0069; G11C 11/1659; G11C 11/1675; G11C 13/003; G11C 13/0097;
(Continued)

(56) References Cited

U.S. PATENT DOCUMENTS

| | | | |
|---|---|---|---|
| 5,894,437 | A | 4/1999 | Chang et al. |
| 8,243,532 | B2 | 8/2012 | Nirschl et al. |

(Continued)

FOREIGN PATENT DOCUMENTS

| | | | |
|---|---|---|---|
| CN | 1484250 | A | 3/2004 |
| CN | 101965638 | A | 2/2011 |

(Continued)

OTHER PUBLICATIONS

S.-W. Chung et al., "4Gbit Density STT-MRAM using Perpendicular MTJ Realized with Compact Cell Structure", IEEE IEDM 2016. total 4 pages.

(Continued)

*Primary Examiner* — Mohammed A Bashar
(74) *Attorney, Agent, or Firm* — Leydig, Voit & Mayer, Ltd.

(57) ABSTRACT

A memory device includes a storage unit array and a controller. The storage unit array contains storage units arranged in M rows and N columns and has M word lines and N bit line pairs. Each of the N bit line pairs includes a bit line and a source line. In operation, after obtaining Q rows of data that are to be written into Q rows of storage units in the storage unit array, the controller writes a first value into each of storage units in a column j in P columns of storage units. The controller then determines to-be-written rows in the Q rows of data, and writes in parallel a second value into each of storage units of the to-be-written rows in the storage units in the column j.

17 Claims, 9 Drawing Sheets

(52) U.S. Cl.
CPC ........ *G11C 13/003* (2013.01); *G11C 13/0097* (2013.01); *G11C 11/1655* (2013.01); *G11C 11/1657* (2013.01); *G11C 13/0026* (2013.01); *G11C 13/0028* (2013.01)

(58) Field of Classification Search
CPC ............ G11C 11/1655; G11C 11/1657; G11C 13/0026; G11C 13/0028
See application file for complete search history.

(56) References Cited

U.S. PATENT DOCUMENTS

| | | | | |
|---|---|---|---|---|
| 9,177,650 | B2 | 11/2015 | Wang et al. | |
| 10,032,511 | B1 * | 7/2018 | Hung | G11C 13/0061 |
| 2004/0032763 | A1 | 2/2004 | Chung | |
| 2009/0207658 | A1 | 8/2009 | Kuo et al. | |
| 2011/0116316 | A1 | 5/2011 | Ueda | |
| 2011/0299330 | A1 | 12/2011 | Ong | |
| 2012/0188813 | A1 * | 7/2012 | Chien | G11C 7/1045 365/148 |
| 2017/0169872 | A1 | 6/2017 | Yoda et al. | |
| 2019/0043580 | A1 * | 2/2019 | Pirovano | G11C 13/0004 |

FOREIGN PATENT DOCUMENTS

| | | | |
|---|---|---|---|
| CN | 102272847 | A | 12/2011 |
| CN | 102483956 | A | 5/2012 |
| CN | 103402806 | A | 11/2013 |
| CN | 103403806 | A | 11/2013 |
| CN | 103903650 | A | 7/2014 |
| CN | 105355780 | A | 2/2016 |
| CN | 105659331 | A | 6/2016 |
| CN | 106169302 | A | 11/2016 |
| JP | S6233398 | A | 2/1987 |
| JP | H10112193 | A | 4/1998 |
| JP | 2013020682 | A | 1/2013 |

OTHER PUBLICATIONS

Hochul Lee et al., "Design of a Fast and Low-Power Sense Amplifier and Writing Circuit for High-Speed MRAM", IEEE Transactions on Magnetics, vol. 51. No. 5, May 2015. total 7 pages.
D. Apalkov et al.. Spin-transfer torque magnetic random access memory (stt-mram). ACM Journal on Emerging Technologies in Computing Systems, vol. 9, No. 2, Article 13, Pub. date: May 2013. pp. 1-35.
X. Bi et al,. Probabilistic design methodology to improve run-time stability and performance of sttram caches. In Proceedings of the International Conference on Computer-Aided Design, ICCAD '12, New York, NY, USA, 2012. ACM. pp. 88-94.
R. Bishnoi et al,. Asynchronous asymmetrical write termination (aawt) for a low power stt-mram. In Design, Automation and Test in Europe Conference and Exhibition (DATE), Mar. 2014. pp. 1-6.
Y. Kim et al,. Write-optimized reliable design of stt mram. In Proceedings of the 2012 ACM/IEEE International Symposium on Low Power Electronics and Design, ISLPED '12, New York, NY, USA, 2012. ACM. pp. 3-8.
J. Hu et al., "Minimizing write activities to non-volatile memory via scheduling and recomputation," IEEE 2010, pp. 101-106.
D. Lee et al. High-performance low energy stt mram based on balanced write scheme. In Proceedings of the 2012 ACM/IEEE International Symposium on Low Power Electronics and Design, ISLPED '12, pp. 9-14, New York, NY, USA, 2012. ACM.
Rajendra Bishnoi et al., "Avoiding unnecessary write operations in STT-MRAM for low power implementation", 2014 IEEE . total 6 pages.
A. Nigam et al. Delivering on the promise of universal memory for spin-transfer torque ram (stt-ram). IEEE 2011, pp. 121-126.
H. Meng et al., "Spin transfer in nanomagnetic devices with perpendicular anisotropy," Applied Physics Letters 88, 172506 2006, pp. 172 506-1-172 506-3.
C. Smullen et al,. Relaxing non-volatility for fast and energy-efficient stt-ram caches. In High Performance Computer Architecture (HPCA), 2011 IEEE 17th International Symposium on, pp. 50-61, Feb. 2011.
G. Sun et al., "Improving energy efficiency of write-asymmetric memories by log style write," ISLPED'12, Jul. 30-Aug. 1, 2012, pp. 173-178.
C. Xu et al., "Device-architecture co-optimization of stt-ram based memory for low power embedded systems," IEEE 2011, pp. 463-470.
P. Zhou et al., "A durable and energy efficient main memory using phase change memory technology," in ISCA'09, Jun. 20-24, 2009, pp. 14-23.
Roy Bell et al., "Dual Referenced Composite Free layer Design for Improved Switching Efficiency of Spin Transfer Torque Random Access Memory", IEEE Electron Device Letters, 2016, total 4 pages.
Zheng Li et al., "Exploiting More Parallelism from Write Operations on PCM", DATE 2016. pp. 768-773.
Jianhui Yue, "Exploiting Subarrays Inside a Bank to Improve Phase Change Memory Performance", 2013 EDA A. total 6 pages.
Yu Du, Mitigating Limited PCM Write Bandwidth and Endurance in Hybrid Memory Systems, PhD Thesis, 2015. total 117 pages.
Wen Zhou et. al, "An Efficient Parallel Scheduling Scheme on Multi-partition PCM Architecture", ISLPED, 2016, total 6 pages.
M. K. Qureshi et al., Improving read performance of Phase Change Memories via Write Cancellation and Write Pausing,, IEEE, 2009. pp. 1-11.
F. Xia et al., "Dwc: dynamic write consolidation for phase change memory systems," in ICS '14, Dec. 2014, pp. 211-220.
Evyatar Hemo et al., "Performance Coding: Codes for Fast Write and Read in Multi-Level NVMs", IEEE Transactions on Communications, vol. 63, No. 3, Mar. 2015, pp. 581-591.
Guillaume Prenat et al., "Beyond STT-MRAM, Spin Orbit Torque RAM (SOT-MRAM) for high speed and high reliability applications", Spintronics-based Computing, Springer, 2015, total 145 pages.
M. Poremba et al., "Fine-Granularity Tile-Level Parallelism in Non-Volatile Memory Architecture with Two-Dimension Bank Subdivision", DAC 2016, total 6 pages.
CN/201780091862, Notice of Rejection, dated Jan. 11, 2022.

* cited by examiner

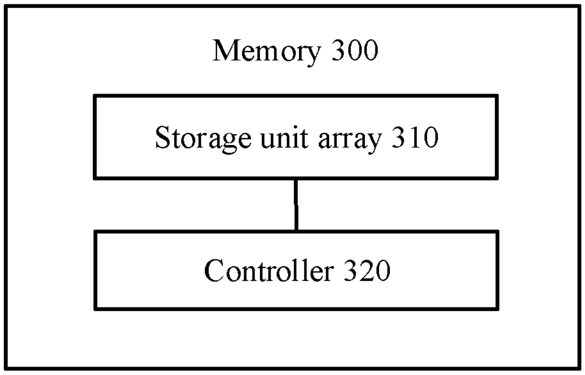

Apply a write voltage used to write a first value to one or more bit line pairs, and apply a turn-on voltage to Q word lines to perform a reset operation, where the one or more bit line pairs include a bit line pair j — 610

After the preset operation is performed, apply a write voltage used to write a second value to the bit line pair j, and apply a turn-on voltage to a word line corresponding to a to-be-written row, to write in parallel the second value into storage units of the to-be-written row — 620

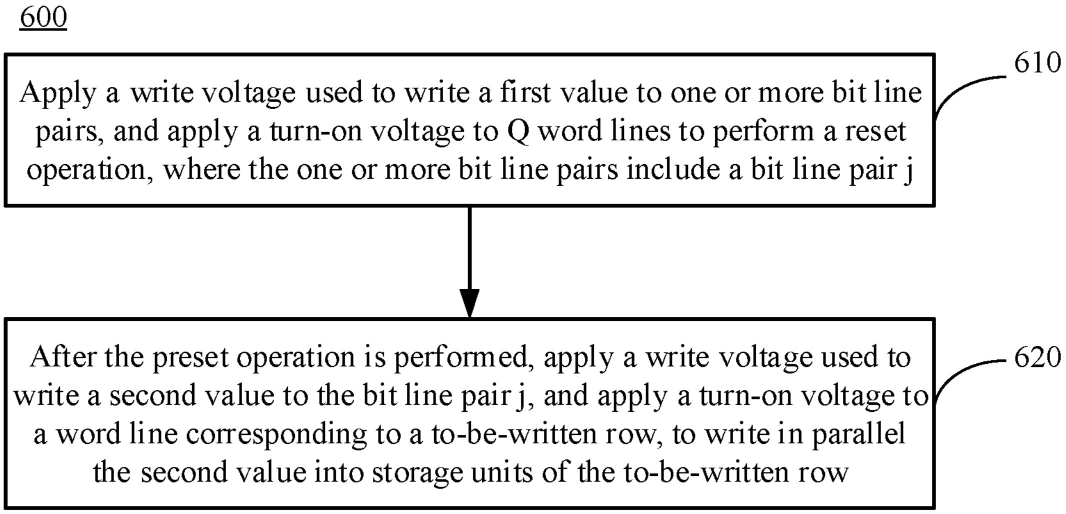

```
A controller obtains Q rows of data, to be written into a storage unit
array, of Q rows of storage units, where each of the Q rows of data
includes P bits to be written into corresponding storage units, Q is a
positive integer less than or equal to M, and P is a positive integer
less than or equal to N
```
— 1210

The controller performs a reset operation on storage units in a column j in P columns of storage units, to write a first value into the storage units in the column j — 1220

The controller determines a to-be-written row in the Q rows of data, where a bit j of data of the to-be-written row is a second value — 1230

The controller writes in parallel the second value into storage units of the to-be-written row in the storage units in the column j — 1240

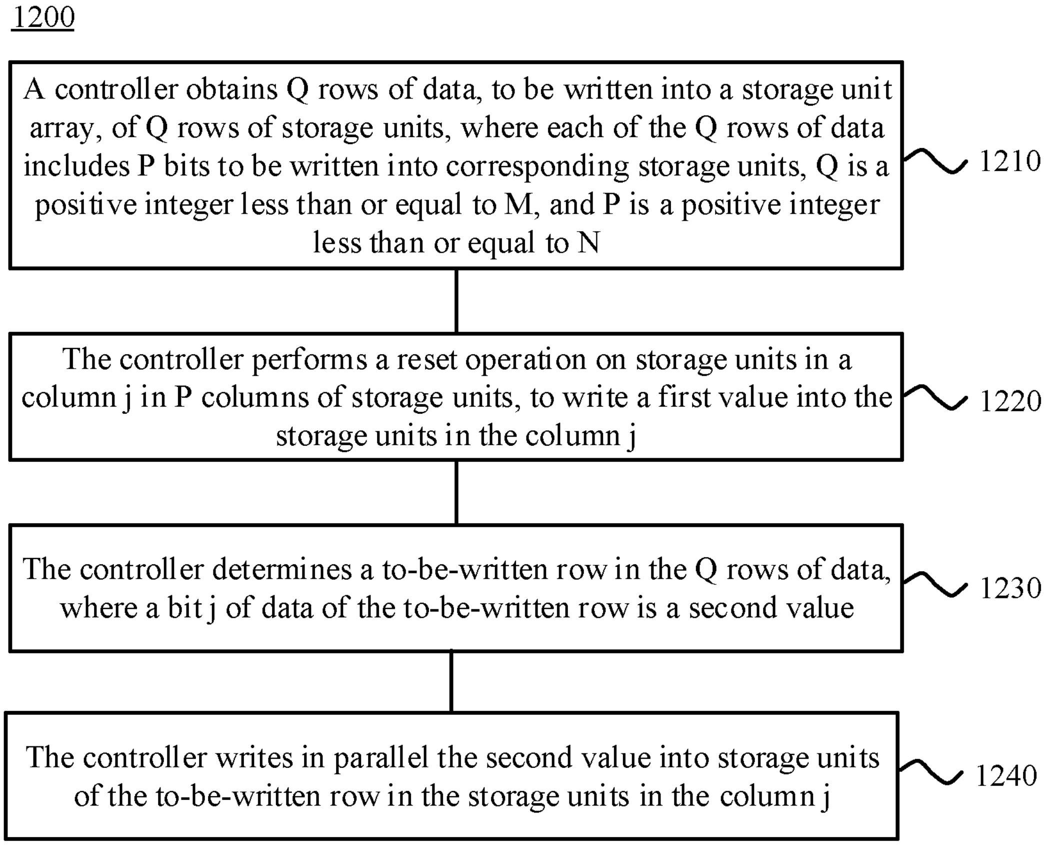

FIG. 12

MEMORY DEVICE AND METHOD FOR WRITING DATA

CROSS-REFERENCE TO RELATED APPLICATIONS

This application is a continuation of International Application No. PCT/CN2017/089871, filed on Jun. 23, 2017, which is hereby incorporated by reference in its entirety.

TECHNICAL FIELD

This application relates to the integrated circuit field, and in particular, to a memory device and a method for writing data.

BACKGROUND

With the development of a mobile device, a portable device, and a wireless device, a non-volatile random access memory (NVRAM) is widely applied. The NVRAM has read/write performance close to that of a dynamic random access memory (DRAM). Once data is written, external electric power is not required to maintain a memory of the NVRAM. For example, the NVRAM includes a resistive random access memory (RRAM), a magnetic random access memory (MRAM), a spin-transfer torque magnetic random access memory (STT MRAM), and the like. However, write efficiency of the NVRAM is relatively low.

SUMMARY

This application provides a memory device and a method for writing data, so that a write throughput of the memory device can be increased and write efficiency can be improved.

According to a first aspect, a memory is provided, including:

a storage unit array, where the storage unit array includes storage units in M rows and N columns, M word lines, and N bit line pairs, each of the N bit line pairs includes a bit line and a source line, where storage units in a row i in the storage unit array are connected to a word line i of the M word lines, storage units in a column j in the storage unit array are connected in parallel between a bit line and a source line in a bit line pair j of the N bit line pairs, both M and N are integers greater than or equal to 2, i is an integer greater than or equal to 0 and less than M, and j is an integer greater than or equal to 0 and less than N; and a controller, connected to the storage unit array and configured to: obtain Q rows of data, to be written into the storage unit array, of Q rows of storage units, where each of the Q rows of data includes P bits to be written into corresponding storage units, Q is a positive integer less than or equal to M, and P is a positive integer less than or equal to N; perform a reset operation on storage units in a column j in P columns of storage units, to write a first value into each of the storage units in the column j; determine to-be-written rows in the Q rows of data, where a bit j of data of each of the to-be-written rows is a second value; and write in parallel the second value into storage units of the to-be-written rows in the storage units in the column j.

The foregoing memory provided in this application can write data by column into each storage unit in the memory. Compared with a manner of writing by row in the prior art, this application provides another write data idea. In addition, when a quantity of rows of to-be-written data is greater than a quantity of columns of to-be-written data, the memory provided in this application can improve write efficiency.

In a possible implementation, the controller is configured to: apply a write voltage used to write the first value to one or more bit line pairs, and apply a turn-on voltage to the Q word lines to perform the reset operation, where the one or more bit line pairs include the bit line pair j; and apply a write voltage used to write the second value to the bit line pair j, and apply a turn-on voltage to word lines corresponding to the to-be-written rows, to write in parallel the second value into the storage units of the to-be-written rows.

It should be understood that the reset operation may be successively performed on each of P columns of storage units, or may be performed on all storage units in the storage unit array.

For example, Q=M. When a reset operation is performed on a column of storage units in the storage unit array, a turn-on voltage used to enable M rows of storage units is applied to M word lines corresponding to the M rows of storage units, and a write voltage used to write "0" is applied between a bit line j and a source line j that are corresponding to the storage units in the column j. For example, a voltage $V_{set}$ is applied to the bit line j, and the source line j is connected to a ground cable $G_{ND}$. In this case, a same value "0" is written into all the storage units in the column j. It is equivalent to that the reset operation is performed on the storage units in the column j, and values of data recorded in all the storage units in the column j are written as "0".

When a reset operation is performed on all storage units in the storage unit array, a turn-on voltage used to enable the M rows of storage units is applied to M word lines corresponding to the M rows of storage units, in other words, all the storage units are conducted, and a write voltage used to write "0" is applied between bit lines and source lines in N bit line pairs that are corresponding to N columns of storage units. For example, a voltage $V_{set}$ is applied to the N bit lines, and N source lines are connected to a ground cable $G_{ND}$. In this case, a same value "0" is written into all the storage units in the storage unit array. It is equivalent to that the reset operation is performed on all the storage units in the storage unit array, and values of data recorded in all the storage units are written as "0".

It should be further understood that when a reset operation is performed on the storage units in the column j, "1" may also be written into each of the storage units in the column j. To be specific, values in each of the storage units in the column j are reset to "1". Then, values in storage units, in the column j, into which "0" needs to be written are rewritten as "0" from "1". This is not limited in this application. Alternatively, when a reset operation is performed on the N columns of storage units, "1" may also be written into each of the N columns of storage units. To be specific, values in each of the N columns of storage units are reset to "1". Then, values in storage units, in each column, into which "0" needs to be written are rewritten by column as "0" from "1".

In a possible implementation, Q>P. In the storage array, a quantity of rows of the storage units is usually far greater than a quantity of columns of the storage units. When a quantity of rows of to-be-written data is greater than a quantity of columns of to-be-written data, the memory provided in this application can improve write efficiency.

In a possible implementation, the memory further includes: a central buffer, configured to buffer Q rows of data to be written into the storage unit array; and the controller is configured to obtain the Q rows of data from the central buffer.

Optionally, the memory in this embodiment of this application may include a plurality of the storage unit arrays. Storage units in a same row in the plurality of the storage unit arrays are controlled by using a same global word line, and different storage unit arrays are controlled by using different slice select lines. When a global word line corresponding to storage units in a row i in the plurality of the storage unit arrays is enabled, word lines (also referred to as local word lines) corresponding to the storage units in the row i in each of the plurality of the storage unit arrays may be driven. After the local word lines corresponding to the storage units in the row i in each storage unit array is charged by using the global word line corresponding to the storage units in the row i, and when a write voltage is applied between a bit line and a source line that are corresponding to storage units in a column j in a certain storage unit array, corresponding data can be written into the storage units in the column j in a plurality of rows of charged storage units.

It should be further understood that the memory may include a plurality of the storage unit arrays. Each storage unit array may have a respective central buffer and a respective row buffer, to buffer M rows of data to be written into the storage unit array.

According to a second aspect, a method for writing data is provided. The method is applied to a memory including a storage unit array and a controller connected to the storage unit array. The storage unit array includes storage units in M rows and N columns, M word lines, and N bit line pairs, and each of the N bit line pairs includes a bit line and a source line, where storage units in a row i in the storage unit array are connected to a word line i of the M word lines, storage units in a column j in the storage unit array are connected in parallel between a bit line and a source line in a bit line pair j of the N bit line pairs, both M and N are integers greater than or equal to 2, i is an integer greater than or equal to 0 and less than M, and j is an integer greater than or equal to 0 and less than N; and the method includes:

obtaining, by the controller, Q rows of data, to be written into the storage unit array, of Q rows of storage units, where each of the Q rows of data includes P bits to be written into corresponding storage units, Q is a positive integer less than or equal to M, and P is a positive integer less than or equal to N;

performing, by the controller, a reset operation on storage units in a column j in P columns of storage units, to write a first value into each of the storage units in the column j; and determining, by the controller in the Q rows of data, to-be-written rows, where a bit j of data of each of the to-be-written rows is a second value; and writing, by the controller, in parallel the second value into storage units of the to-be-written rows in the storage units in the column j.

In a possible implementation, the performing, by the controller, a reset operation on storage units in a column j in P columns of storage units, to write a first value into each of the storage units in the column j includes: applying, by the controller, a write voltage used to write the first value to one or more bit line pairs, and applying a turn-on voltage to the Q word lines to perform the reset operation, where the one or more bit line pairs include the bit line pair j; and the determining, by the controller in the Q rows of data, to-be-written rows, where a bit j of data of each of the to-be-written rows is a second value; and the writing, by the controller, in parallel the second value into storage units of the to-be-written rows in the storage units in the column j includes: applying, by the controller, a write voltage used to write the second value to the bit line pair j, and applying a turn-on voltage to word lines corresponding to the to-be-written rows, to write in parallel the second value into the storage units of the to-be-written rows.

In a possible implementation, Q>P.

In a possible implementation, the memory further includes a central buffer. The method further includes: buffering, by the central buffer, the Q rows of data to be written into the storage unit array; and the obtaining, by the controller, Q rows of data, to be written into the storage unit array, of Q rows of storage units includes: obtaining, by the controller, the Q rows of data from the central buffer.

According to a third aspect, a computer is provided, including the memory in the first aspect and the various implementations of the first aspect.

According to a fourth aspect, a computer readable storage medium is provided. The computer readable storage medium stores a program, and the program enables the memory to perform any write data method in the second aspect and the various implementations of the second aspect.

BRIEF DESCRIPTION OF DRAWINGS

FIG. 5 is a schematic block diagram of a memory according to an embodiment of this application;

FIG. 6 is a schematic flowchart of a write data method according to an embodiment of this application;

FIG. 12 is a schematic flowchart of a write data method according to an embodiment of this application.

DESCRIPTION OF EMBODIMENTS

The following describes technical solutions of this application with reference to the accompanying drawings.

Figure 1:
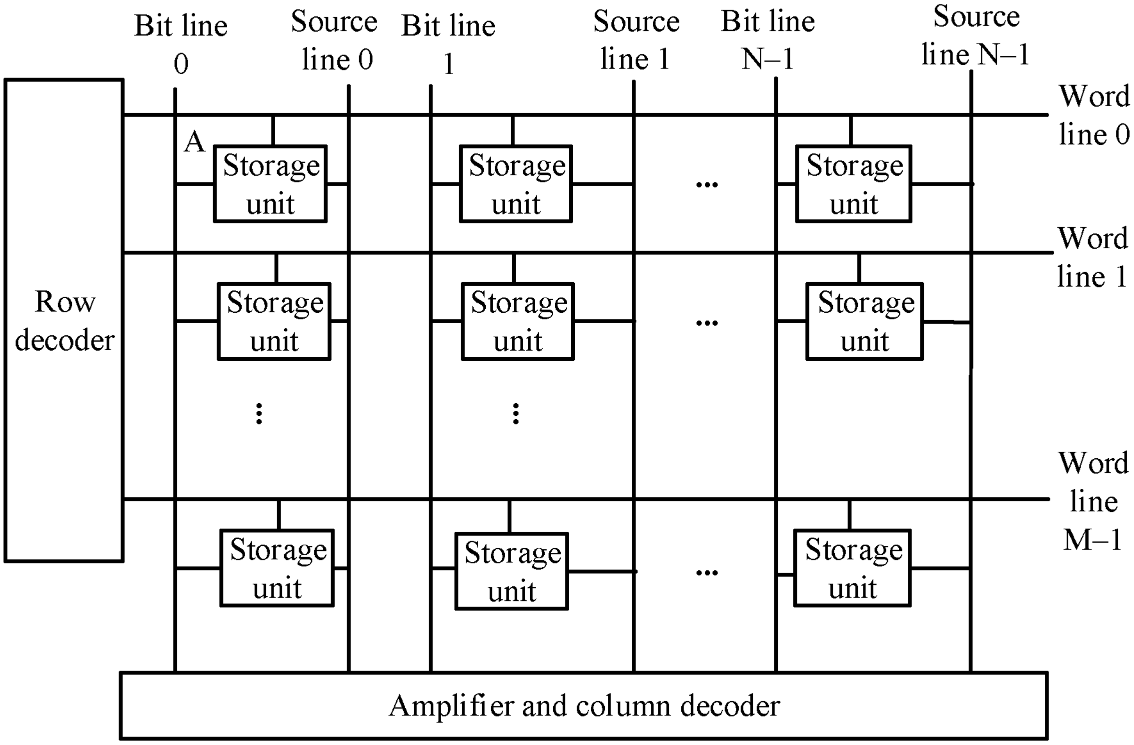
FIG. 1 is a schematic structural diagram of an NVM storage unit array.

FIG. 1 is a schematic structural diagram of an NVM storage unit array. The NVM storage unit array shown in FIG. 1 includes storage units in M rows and N columns. In other words, the storage unit array (hereinafter referred to as a "storage array") includes M×N storage units. Each storage unit includes a storage structure used to record data. It should be understood that in an embodiment of this application, an NVM storage unit is briefly referred to as a storage unit. FIG. 1 shows N bit line pairs (a bit line pair includes a bit line and a source line) and M word lines, where M and N are positive integers. N storage units in each row are connected to one word line, and M storage units in each column are connected in parallel between a bit line and a source line in a pair.

Each storage unit is connected to a bit line (BL), a source line (SL), and a word line (WL). When an input address is provided, one word line may be selected, and the word line may find a corresponding "word" in a storage matrix. When a plurality of bits included in the word are read, an output line used to read a value of each bit is referred to as a "bit line". A quantity of bits of data in each word may be referred to as a "word length". For example, as shown in FIG. 1, a storage unit connected to a bit line 0, a source line 0, and a word line 0 is a storage unit A. M word lines may be connected to a row decoder, and the row decoder may enable one of the word lines based on an input address. Bit lines may be connected to a column circuit, and the column circuit may include an amplifier and a column decoder. The amplifier may amplify data detected on the bit line for ease of reading, and the column decoder is configured to control a multi-way switch in the column circuit, to select a bit line connected to storage units that need to access data in the row.

Figure 4:
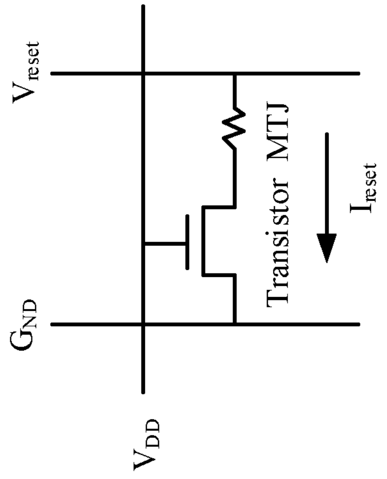
FIG. 4 is a schematic diagram of writing data of a storage unit.
Figure 3:
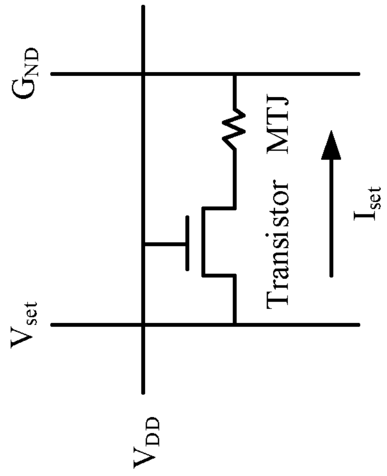
FIG. 3 is a schematic diagram of writing data of a storage unit.
Figure 2:
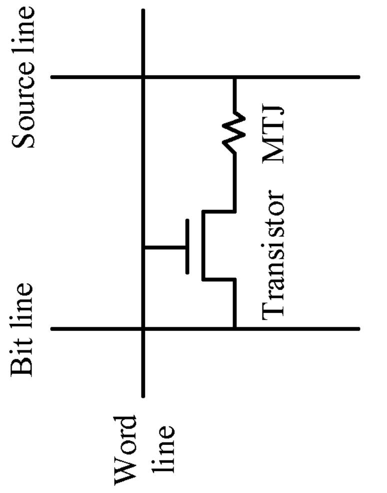
FIG. 2 is a schematic structural diagram of a storage unit.

The following uses an STT MRAM as an example to describe how an STT MRAM storage unit records information with reference to schematic structural diagrams of storage units shown in FIG. 2, FIG. 3, and FIG. 4. The STT MRAM is one type of an NVM. It should be understood that in this embodiment of this application, the STT MRAM is used as an example for description, but this application is not limited thereto. All memories that include the storage units described in this embodiment of this application are within the protection scope of this embodiment of this application.

The STT MRAM is a newly emerging magnetic random access memory. The STT MRAM storage unit includes a magnetic tunnel junction (MTJ) and a transistor such as an MOS transistor. As shown in FIG. 2, a gate of the transistor is connected to a word line, a source of the transistor is connected to one end of the MTJ, the other end of the MTJ is connected to a source line, and a drain of the transistor is connected to a bit line.

As shown in FIG. 3, when a voltage $V_{DD}$ is applied to the word line, the transistor is conducted (or referred to be enabled or activated). In this case, if a voltage $V_{set}$ is applied to the bit line and the source line is $G_{ND}$, a current $I_{set}$ whose direction is from left to right is generated, and therefore "0" is written. In this case, a resistance of the MTJ is relatively small. As shown in FIG. 4, in this case, if a voltage $V_{reset}$ is applied to the source line and the bit line is $G_{ND}$, a current $I_{reset}$ whose direction is from right to left is generated, and therefore "1" is written. In this case, a resistance of the MTJ is relatively large. Herein, $V_{DD}$ may be used to represent a power voltage, and $G_{ND}$ may be used to represent a ground cable.

Similarly, when data is read, a small bias voltage may be applied between the bit line and the word line. For example, a bias voltage is applied to the bit line, and the source line is $G_{ND}$. The bias voltage may be less than $V_{set}$ and $V_{reset}$, and can only generate a small constant current. When the small constant current passes through the MTJ from the bit line over the conducted MOS transistor, information stored in a storage unit can be read by detecting a resistance of the storage unit.

If data is written by row into a storage unit array of the STT MRAM, write efficiency of the memory may be severely affected. For example, in Table 1, a group of to-be-written data includes 128 bits in 16 rows and 8 columns, and eight bits in each row form a word. After a row of data is written into a row of storage units, another row of data is written into a next row of storage units. It can be learned that 16 times of word writing needs to be performed when all words in Table 1 are written. When a large quantity of words need to be written into a storage array, a write throughput in this write method may not meet a write requirement, and write efficiency of the memory may be severely affected. Therefore, it is quite necessary to put forward a solution to improve efficiency of writing data.

TABLE 1

| Word | Data |
|---|---|
| 0 | 0000 1101 |
| 1 | 1101 1111 |
| 2 | 1111 0010 |
| . . . | . . . |
| 14 | 0011 1101 |
| 15 | 1111 1111 |

FIG. 5 is a schematic block diagram of a memory 300 according to an embodiment of this application. The memory 300 may be, for example, an NVM, and the memory 300 includes a storage unit array 310 and a controller 320. The controller 320 may be a memory controller, or may be referred to as a storage controller; may be an NVM controller, or may be referred to as an NVM medium controller. For example, the controller 320 may be disposed inside a memory module of the NVM, to control the NVM. In other words, the controller 320 is the NVM controller. Alternatively, the controller 320 may be the storage controller outside a memory module, to control the NVM by using the storage controller.

The storage unit array 310 includes storage units in M rows and N columns, M word lines, and N bit line pairs, and each of the N bit line pairs includes a bit line and a source line, where storage units in a row i in the storage unit array are connected to a word line i, storage units in a column j in the storage unit array are connected in parallel between a bit line and a source line in a bit line pair j of the N bit line pairs, and both M and N are integers greater than or equal to 2, i is an integer greater than or equal to 0 and less than M, and j is an integer greater than or equal to 0 and less than N (in other words, a value of i is from 0 to M−1, and a value of j is from 0 to N−1).

The controller 320 is connected to the storage unit array 310 and is configured to:

obtain Q rows of data, to be written into the storage unit array, of Q rows of storage units, where each of the Q rows of data includes P bits to be written into corresponding storage units, Q is a positive integer less than or equal to M, and P is a positive integer less than or equal to N;

perform a reset operation on storage units in a column j in P columns of storage units, to write a first value into each of the storage units in the column j;

determine to-be-written rows in the Q rows of data, where a bit j of data of each of the to-be-written rows is a second value; and write in parallel the second value into storage units of the to-be-written rows in the storage units in the column j.

Specifically, the memory includes storage units in M rows and N columns, storage units in a same row in the M rows of storage units are connected in series to a same word line, and storage units in a same column in the N columns of storage units are connected in parallel between a same bit line and a same source line. When data is written into the storage unit array, corresponding data is written by column into the N columns of storage units in the storage unit array. Each time when the controller 320 performs a set of write operations, the controller 320 may write corresponding Q rows of data into Q rows of storage units in the storage unit array, and each row of data includes P bits to be written into corresponding storage units. The M rows of storage units can be written by performing a plurality of sets of write operations. Specifically, when the write operations are performed, data of a bit j in the Q rows of data may be written in parallel into storage units in a column j in the storage unit array. The storage units in the column j herein are storage units in the N columns of storage units, and j is set to a value in sequence from 0 to N−1. In actual application, Q may be equal to M. When Q is equal to M, the controller 320 obtains M rows of data to be written into the storage unit array. Each of the Q rows of data includes P bits to be written into corresponding storage units. The controller 320 performs a reset operation on storage units in a column j in P columns of storage units, to write a first value into each of the storage units in the column j. Then, the controller 320 determines rows whose bit j in the Q rows of data is a second value as to-be-written rows, and writes in parallel the second value into storage units of the to-be-written rows in the storage units in the column j. After the reset operation is performed, the controller 320 writes the second value into only storage units in a row whose bit j in the Q rows of data is the second value. To be specific, only the first value in the storage units in the row whose bit j is the second value is rewritten as the second value, and the first value is retained in the storage units in another row.

The controller 320 may include a row decoder, an amplifier, a column decoder, another control circuit, and the like. Therefore, the controller 320 can control a read/write operation and another operation of the storage unit array 310.

Optionally, Q is greater than P. To be specific, in storage units in Q rows and P columns on which a write operation is to be performed, a quantity of rows is greater than a quantity of columns; in other words, for data to be written into the storage unit array, a quantity of rows of the data is greater than a quantity of bits of each row of data.

Optionally, in a process in which the reset operation is performed and the first value in the storage units in the row whose bit j in the Q rows of data is the second value is rewritten as the second value, the controller 320 may specifically perform a write data method 600 shown in FIG. 6 according to an embodiment of this application. As shown in FIG. 6, the controller 320 is specifically configured to:

in 610, apply a write voltage used to write the first value to one or more bit line pairs, and apply a turn-on voltage to the Q word lines to perform the reset operation, where the one or more bit line pairs include the bit line pair j; and in 620, after the preset operation is performed, apply a write voltage used to write the second value to the bit line pair j, and apply a turn-on voltage to a word line corresponding to the to-be-written row, to write in parallel the second value into the storage units in the to-be-written row.

Specifically, a process of writing the first value is equivalent to a process of performing the reset operation, and a process of writing the second value is equivalent to a process of modifying data. The controller 320 may perform a reset operation on all storage units in a column j, to write a first value, for example, "0", into the storage units in the column j. Then, the controller 320 performs a write operation on storage units, in the storage units in the column j, into which the second value is to be written, to rewrite a first value "0" in the storage units into which the second value is to be written in the storage units in the column j as a second value "1".

It should be understood that herein the determining a row whose bit j in the Q rows of data is a second value as a to-be-written row is a process of applying a turn-on voltage to a word line corresponding to the to-be-written row.

For example, Q=M. First, a turn-on voltage used to enable the M rows of storage units is applied to M word lines corresponding to the M rows of storage units, and a write voltage used to write "0" is applied between a bit line and a source line that are corresponding to storage units in a column j. For example, a voltage $V_{set}$ is applied to the bit line, and the source line is connected to a ground cable $G_{ND}$. In this case, a same value "0" is written into all the storage units in the column j. It is equivalent to that a reset operation is performed on the storage units in the column j and values of data recorded in all the storage units in the column j are written as "0".

Then, after the reset operation is performed, the controller 320 determines specific storage units, in the column j, into which "1" needs to be written, and applies a turn-on voltage to only a word line connected to the storage units into which "1" needs to be written, to enable the storage units into which "1" needs to be written. In addition, a write voltage used to write "1" is applied between a word line j and a source line j that are corresponding to the storage units in the column j. For example, a voltage $V_{reset}$ is applied to the source line j connected to the storage units in the column j, and the bit line is $G_{ND}$. In this case, "1" is written in parallel into only enabled storage units into which "1" needs to be written, and "0" is retained in storage units that are not enabled in the column j.

It should be understood that when the reset operation is performed, the reset operation may also be performed on all storage units in the storage unit array, to further improve write efficiency. A turn-on voltage $V_{DD}$ used to enable the M rows of storage units is applied to M word lines corresponding to the M rows of storage units, in other words, all the storage units are conducted, and a write voltage used to write "0" is applied between bit lines and source lines in N bit line pairs that are corresponding to N columns of storage units. For example, a voltage $V_{set}$ is applied to N bit lines, and N source lines are connected to a ground cable $G_{ND}$. In this case, a same value, for example, "0", is written into all storage units in the entire storage unit array. It is equivalent to that the reset operation is performed on all the storage units in the storage unit array, and values of data recorded in all the storage units are written as "0". Then, a write operation is successively performed on each of the N columns of the storage units. To be specific, a turn-on voltage $V_{DD}$ is applied to a word line connected to storage units into which "1" needs to be written in the storage units in the column j, to enable the storage units into which "1" needs to be written, and a write voltage used to write "1" is applied between a bit line and a source line that are connected to the storage units in the column j. In this case, "1" is written in parallel into only enabled storage units into which "1" needs to be written, and "0" is retained in storage units that are not enabled in the column j.

It should be further understood that when a reset operation is performed on the storage units in the column j, "1" may also be written into each of the storage units in the column j. To be specific, values in each of the storage units in the column j is reset to "1". Then, values in storage units, in the column j, into which "0" needs to be written are rewritten as "0" from "1". This is not limited in this application. Alternatively, when a reset operation is performed on the N columns of storage units, "1" may also be written into the N columns of storage units. To be specific, values in each of the N columns of storage units is reset to "1". Then, values in storage units, in each column, into which "0" needs to be written are rewritten by column as "0" from "1".

The foregoing memory provided in this application can write data by column into each storage unit in the memory during data writing. Compared with a manner of writing by row in the prior art, this application provides another write data idea. In addition, when a quantity of rows of to-be-written data is greater than a quantity of columns of to-be-written data, the memory provided in this application can improve write efficiency.

Optionally, any storage unit in the storage unit array includes a magnetic tunnel junction MTJ and a first transistor connected to the MTJ. A gate of the first transistor is connected to a word line, a drain of the first transistor is connected to a bit line, and a source of the first transistor is connected to a source line.

Figure 7:
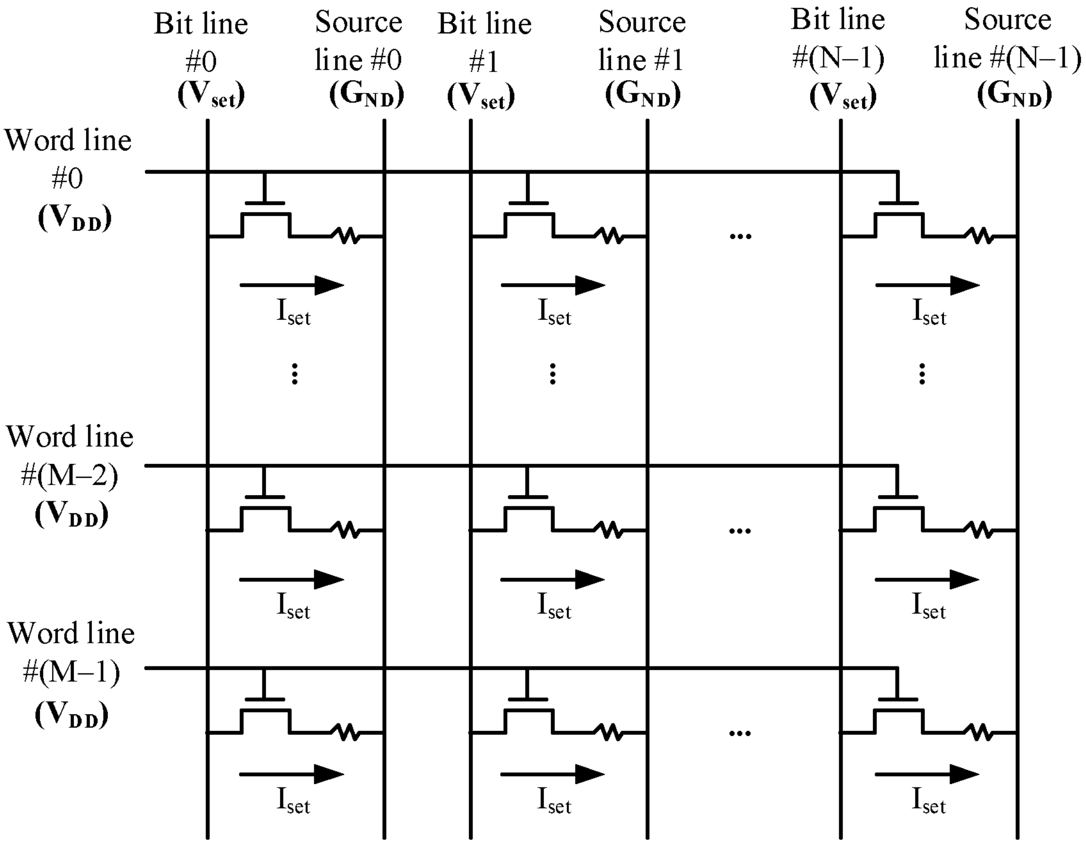
FIG. 7 is a schematic diagram of a storage unit array according to an embodiment of this application.

For example, it is assumed that Q=M. FIG. 7 shows a schematic diagram of a storage unit array. The storage unit array includes M rows and N columns, and the M rows of storage units are connected in series to M word lines. When a turn-on voltage $V_{DD}$ is applied to a word line of each row of storage units, the transistor in the row of storage units is conducted. Each of N columns of storage units is connected in parallel between a bit line and a source line in a pair. When different write voltages are applied between the bit line and the source line that are connected to the column of storage units, different values may be written into the column of storage units. When data is written by column into the memory, a reset operation is performed first. To be specific, same data, for example, "0" is written into all storage units in the storage array. As shown in FIG. 7, a turn-on voltage used to enable the M rows of storage units is applied to the M word lines corresponding to the M rows of storage units. In this case, N storage units connected in series to each word line from a word line #0 to a word line #(M−1) are in a conducted state, and in this case, a voltage $V_{set}$ is applied between a bit line #0 and a bit line #(N−1), and a source line #0 to a source line #(N−1) are $G_{ND}$. Therefore, "0" is written into each of the N columns of storage units, and then the M word lines are disabled. In this case, "0" is written into each storage unit in the storage unit array.

Figure 8:
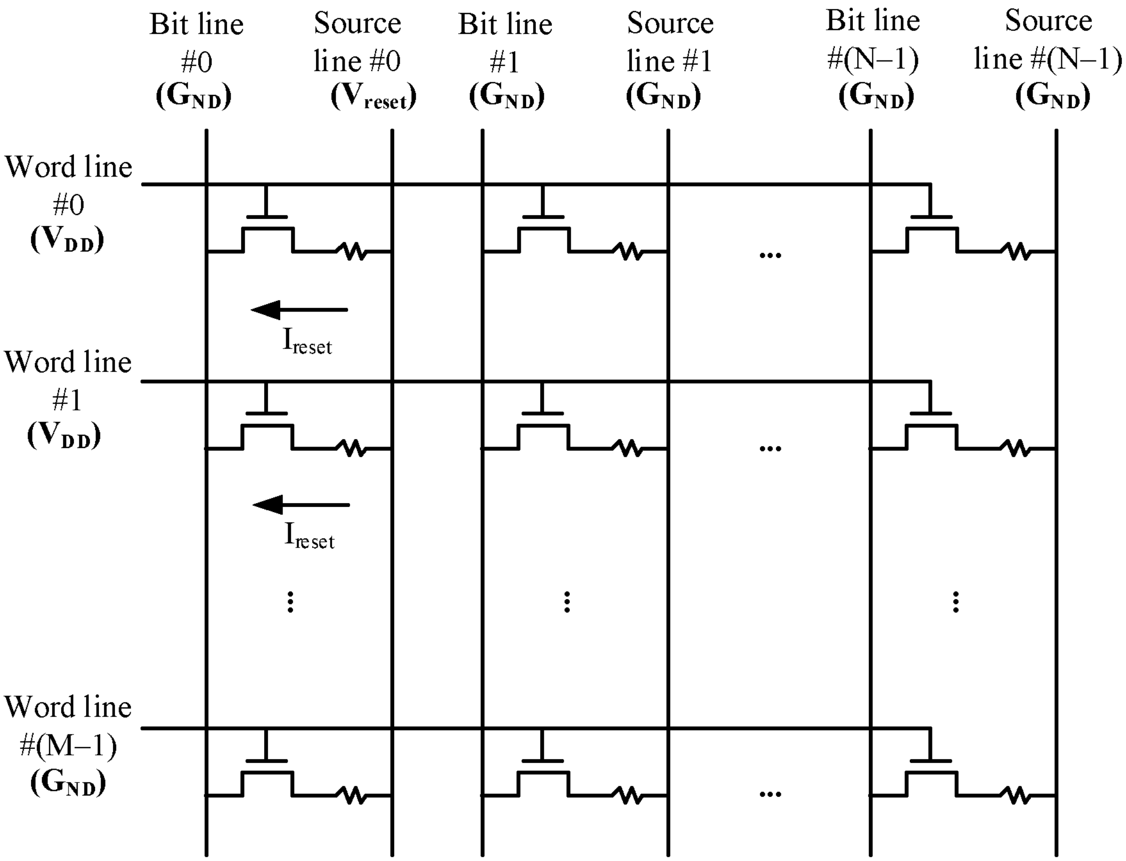
FIG. 8 is a schematic diagram of a storage unit array according to an embodiment of this application.

Then, a write operation is successively performed by column on each of the N columns of the storage units. As shown in FIG. 8, it is assumed that data is written into storage units in a column 0. The controller 320 obtains vectors $(1, 1, 0, 0, \ldots, 0)^T$ corresponding to the storage units in the column 0. The vectors indicate that "1" needs to be written into a storage unit in a row 0 and a storage unit in a row 1 that are in the storage units in the column 0, and that "0" needs to be written into storage units from a row 2 to a row M−1. The row 0 and the row 1 in the M rows of data are to-be-written rows. Therefore, a turn-on voltage needs to be applied to only a word line #0 and a word line #1 again, to conduct transistors of the storage units in the row 0 and the storage units in the row 1 that are in the storage units in the column 0. In addition, an opposite voltage is applied between a bit line and a source line in a pair that is corresponding to the storage units in the column 0. To be specific, a voltage $V_{reset}$ is applied to a source line #0, and a bit line #0 is $G_{ND}$. Therefore, "1" is written into the storage units in the row 0 and the row 1 that are in the storage units in the column 0, and "0" is retained in the storage units from a row 2 to a row M−1 in the storage units in the column 0. In FIG. 8, when a write operation is performed on storage units in a column 0, bit lines and word lines that are connected to storage units from a column 1 to a column N−1 are $G_{ND}$. When "1" is written into storage units in a row 0 and storage units in a row 1 that are in the storage units in the column 0, a word line #2 to a word line #(M−1) that are connected to the storage units from a row 2 to a row M−1 in the storage units in the column 0 are $G_{ND}$.

In an existing row-by-row write manner, a next word needs to be written after a word is written. For example, eight bits in each row in Table 1 are a word, and another word in a next row is to be written after a word in each row is written. A column-by-column write manner breaks traditional thinking of word-by-word writing. In the column-by-column write manner, values of a plurality of words need to be obtained, and are written by column into same bits of the plurality of words. For example, in Table 1, bits 0 of 16 words (a word 0 to a word 15) are first written into a column of storage units, and bits 1 of the word 0 to the word 15 are written into a next column of storage units, until bits 7 of the word 0 to the word 15 are written successively into a corresponding column of storage units. Only when the bits 7 of the word 0 to the word 15 are also written into the corresponding column of storage units, each word of the word 0 to the word 15 can be completely stored in the storage units. It is different from the existing row-by-row write manner in which a word can be stored after each row is written.

Therefore, a first voltage is applied between a bit line and a source line of each column of storage units, to write same data, for example, "0", into all storage units. In addition, a second voltage is applied between the bit line and the source line of each column of storage units, and only storage units, in each column of storage units, into which "1" needs to be written are enabled by using a corresponding word line, to rewrite data in the storage units into which "1" needs to be written as "1" from "0". Therefore, a write throughput is increased, write efficiency is improved, and storage performance of the memory is further improved.

In the column-by-column write manner, a plurality of rows of data to be written need to be learned in advance. For example, only after the word 0 to the word 7 in Table 1 are obtained, data of same bits in the word 0 to the word 7 can be written into a same column of storage units. Therefore, a central buffer is required to store all the word 0 to the word 7.

Figure 9:
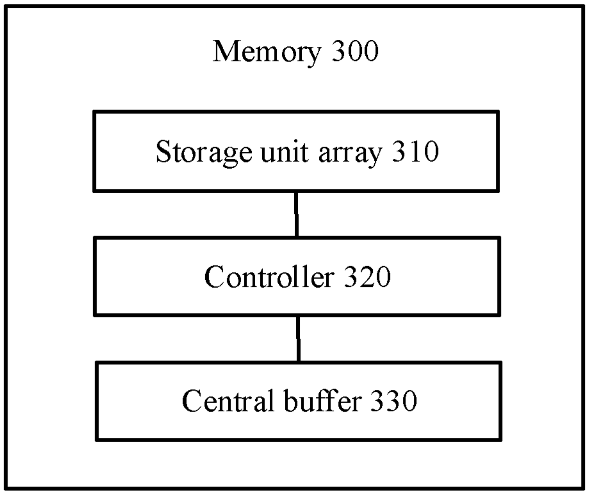
FIG. 9 is a schematic block diagram of a memory according to an embodiment of this application.

Optionally, as shown in FIG. 9, the memory 300 further includes a central buffer 330, configured to buffer M rows of data to be written into the storage unit array.

The central buffer 330 may be connected to a controller 320, and the controller 320 may obtain Q rows of data buffered by the central buffer 330, and write the Q rows of data into a storage unit array 310 according to the foregoing manner.

Specifically, the central buffer 330 may buffer the M rows of data to be written into the storage unit array. The central buffer 330 is connected to a row buffer, and may receive data from the row buffer (row buffer). A person skilled in the art may know that the row buffer in the memory generally can buffer only one row of data. To implement the manner in which data is written by column into the storage array in this embodiment of this application, the controller 320 needs to simultaneously obtain a plurality of rows of data. Therefore, the central buffer 330 is disposed herein to buffer the M rows of data to be written into the storage unit array. In actual application, the data to be written into the storage unit array may be buffered in the row buffer, and the data buffered in the row buffer is further forwarded to the central buffer 330. When the central buffer 330 stores a certain quantity of rows of data, for example, Q rows of data, the controller 320 writes the data in the central buffer 330 into the storage unit array in the column-by-column write manner.

A size of a row of data that can be buffered by the row buffer may be N bits (bit). If each set of write operations can write Q rows of data into the storage unit array, the central buffer 330 at least needs to simultaneously buffer Q rows of data. In other words, the central buffer 330 needs to receive the Q rows of data sent by the row buffer for a plurality of times, and each row of data includes N bits. In this way, a long time needs to be waited. To further improve write efficiency, optionally, before performing the write operation, the controller 320 obtains the Q rows of data from the central buffer 330, and a size of each row of data may be P bits. P is less than or equal to N, and P may be an integer multiple of a size of a byte. For example, when a size of a word is eight bits, P is a multiple of 8.

For example, a row of data received by the central buffer 330 from the row buffer includes N bits, and the central buffer 330 buffers the N bits in the row in a unit of P bits. For example, the central buffer 330 herein may be set as that data that can be stored in each row is P bits, and P is less than or equal to a quantity N of bits of data that can be stored in each row in the row buffer. In other words, a size of the row of data in the row buffer is N bits, and a size of the row of data in the central buffer 330 is P bits. It is assumed that N=2P, in the central buffer 330, a row of data that includes N bits and that is received from the row buffer can be divided into two rows to be stored, and P bits are stored in each row. In this way, the controller 320 may complete writing of the storage unit array by performing a plurality of sets of write operations. Each set of write operations is performed on Q rows of data and each row of data includes P bits, and storage units in Q rows and P columns may be fully written by each set of write operations.

In other words, when data is written into the storage unit array, one set of write operations may be performed each time, to write Q rows of data into the storage unit array. To be specific, data of bits j in the Q rows of data is successively written into storage units in a column j in the storage unit array. Each row of data in the Q rows includes P bits that need to be written into corresponding P columns of storage units. In this way, after buffering the Q rows of data, the central buffer 330 performs a set of write operations, to write the Q rows of data into corresponding storage units in Q rows and P columns. After buffering another Q rows of data (each row of data includes P bits), the central buffer 330 performs the same set of write operations, to write the another Q rows of data into another storage units in Q rows and P columns until all storage units in the storage unit array are written. In this way, write efficiency is further improved.

In actual application, when buffering of the row buffer fails, it indicates that there is data in the row buffer. In this case, the controller initiates a pre-charge operation, and forwards the data in the row buffer to the central buffer 330. The central buffer 330 buffers the row of data received from the row buffer, and determines whether a quantity of rows of data, to be written into the P columns of storage units, buffered in the central buffer 330 is greater than a preset value Q. When the central buffer 330 buffers Q rows of data, the controller 320 may obtain the Q rows of data in the central buffer 330 and start a set of write operations. A size of each row of data in the Q rows of data is P bits, or in other words, each of the Q rows of data includes data of P bits to be written into the P columns of storage units. In a process of performing the write operation, the controller 320 may write by column the Q rows of data (each row of data includes P bits) obtained from the central buffer 330 into corresponding P columns of storage units in the storage unit array. For example, data of a bit j in the data of P bits is written into storage units in a column j of the P columns of storage units. After the Q rows of data are written, a storage space of the central buffer 330 may be released to some extent.

It should be understood that when the data in the column j is written into the storage units in the column j in the storage unit array, a location of a storage unit into which the data needs to be written may be located based on a column addresses of the data in the column j and a row address of each bit in the data in the column j.

Table 2 is used as an example. It is assumed that a set of write operations is performed to write data of Q rows and P columns into the storage unit array, where Q=32, and P=8. The row buffer may buffer one row of data each time, namely, data from a bit 0 to a bit 15 in any row of data in Table 2. Each bit of data has a row address and a column address. It is assumed that a row address of data of bit j in a row i is $M_i$ and a column address of the data of bit j in the row i is $N_j$, where $0 \le i \le 31$, and $0 \le j \le 15$. The row buffer may transfer a bit 0 to a bit 15 of data in the row i to the central buffer 330. However, if the central buffer 330 can store at most eight bits of data in each row of data, the central buffer may buffer the bit 0 to a bit 7 and a bit 8 to the bit 15 of the data in the row i in the row buffer into different rows in the central buffer 330. It is assumed that eight bits of data whose column addresses are respectively $N_0$ to $N_7$ have been buffered enough in 32 rows (row addresses of each row of data in the 32 rows are respectively $M_0$ to $M_{31}$) in the central buffer 330. In this case, a set of write operations may be started, eight bits of data whose column addresses are $N_0$ to $N_7$ in the 32 rows of data are respectively written into eight columns of storage units whose column addresses are $N_0$ to $N_7$ in the storage unit array. When eight bits of data whose column addresses are respectively $N_8$ to $N_{15}$ in the central buffer 330 have been buffered enough for 32 rows (row addresses of each row of data in the 32 rows are respectively $M_0$ to $M_{31}$), the eight bits of data whose column addresses are respectively $N_8$ to $N_{15}$ in the 32 rows of data are respectively buffered into eight columns of storage units whose column addresses are respectively $N_8$ to $N_{15}$ in the storage unit array.

It should be understood that in this embodiment of this application, the data transferred from the row buffer to the central buffer 330 is dirty data in the row buffer. If the data is not dirty data, the data does not need to be written back into the storage unit array 310, and does not need to be transferred to the central buffer 330 either. In other words, the central buffer 330 only needs to buffer the dirty data. In this embodiment of the present invention, the dirty data is data different from the data in a storage unit. In other words, dirty data is data that needs to be written into a storage unit. Before the data is transferred from the row buffer to the central buffer 330, the controller 320 may query which data in the row buffer is dirty data, and forward the determined dirty data to the central buffer 330. In actual application, each row in the row buffer includes a flag bit used to indicate whether data in the row is the dirty data. The controller 320 may determine whether data in a certain row is dirty data based on the flag bit in the row buffer.

TABLE 2

| Row | Data | |
|---|---|---|
| | Word (bit 0 to bit 7) | Word (bit 8 to bit 15) |
| Row 0 | 0000 0000 (Row address $M_0$, column addresses $N_0$ to $N_7$) | 0010 1110 (Row address $M_0$, column addresses $N_8$ to $N_{15}$) |
| Row 1 | 1101 1111 (Row address $M_1$, column addresses $N_0$ to $N_7$) | 0010 1101 (Row address $M_1$, column addresses $N_8$ to $N_{15}$) |
| Row 2 | 1111 0010 (Row address $M_2$, column addresses $N_0$ to $N_7$) | 0100 1111 (Row address $M_2$, column addresses $N_8$ to $N_{15}$) |
| . . . | | . . . |
| Row 30 | 0011 1101 (Row address $M_{30}$, column addresses $N_0$ to $N_7$) | 0010 1100 (Row$M_{30}$, column addresses $N_8$ to $N_{15}$) |
| Row 31 | 1111 1111 (Row address $M_{31}$, column addresses $N_0$ to $N_7$) | 1111 1111 (Row address $M_{31}$, column addresses $N_8$ to $N_{15}$) |

It should be understood that the memory in this embodiment of this application may include a plurality of the storage unit arrays 310. The following describes a case in which the memory in this embodiment of this application includes the plurality of the storage unit arrays 310 with reference to FIG. 10.

Figure 10:
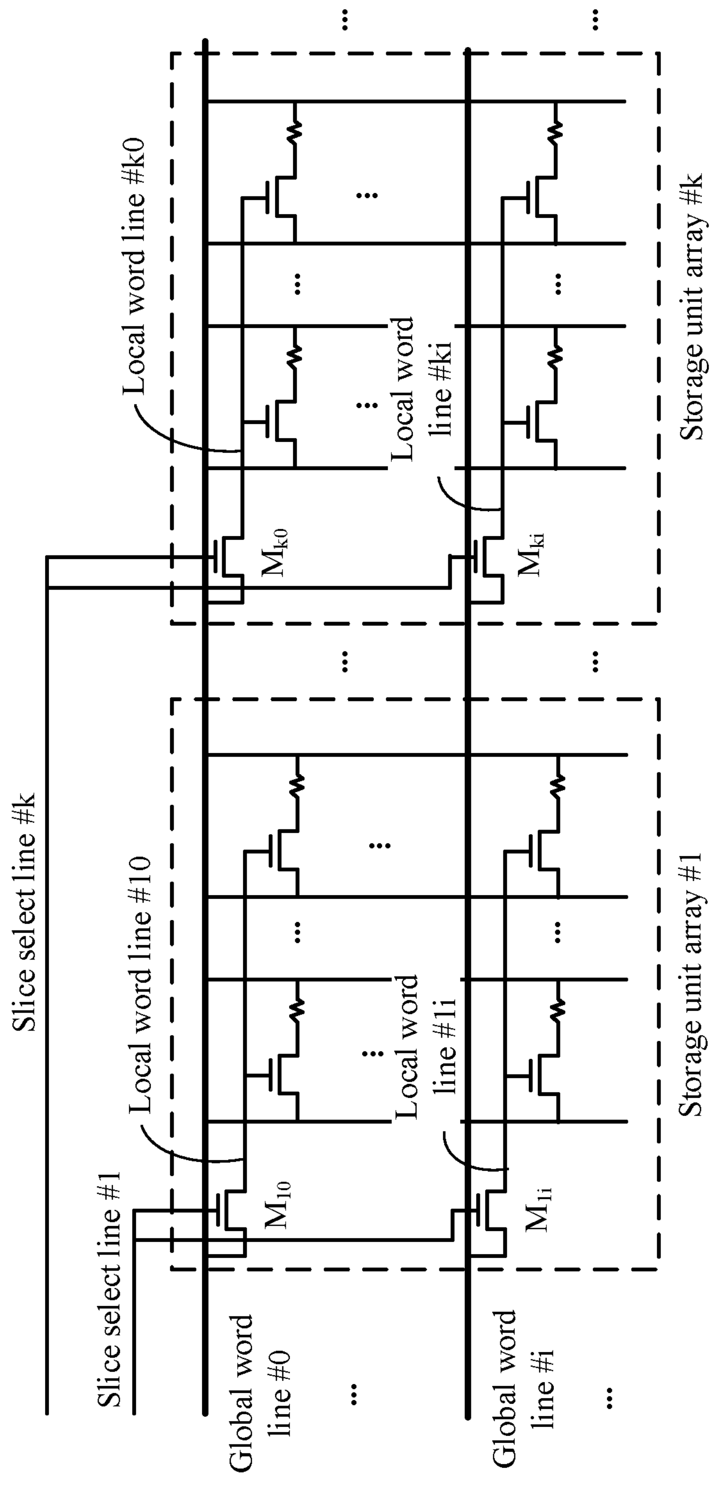
FIG. 10 is a schematic diagram of a connection of a plurality of storage unit arrays according to an embodiment of this application.

FIG. 10 is a schematic diagram of a connection of a plurality of storage unit arrays. FIG. 10 shows any two storage unit arrays in the plurality of storage unit arrays: a storage unit array #1 and a storage unit array #k. Storage units in a same row in the plurality of storage unit arrays are controlled by using a same global word line, and different storage unit arrays are controlled by using different slice select lines. When a global word line corresponding to storage units in a row i in the plurality of the storage unit arrays is enabled, a word line (compared with the global word line, a word line herein may be referred to as a local word line, and in this embodiment of this application, the local word line may also be referred to as a slice word line) corresponding to the storage units in the row i in each of the plurality of the storage unit arrays may be driven. Once the local word line corresponding to the storage units in the column i in the storage unit array is charged by using the global word line corresponding to the storage units in the row i, the global word line corresponding to the storage units in the column i is disabled, so that the local word line corresponding to the storage units in the column i in each storage unit array keeps a high electrical level, and is isolated from the global word line. For example, if data needs to be written into any plurality of rows of storage units in the storage unit array #1, the controller 320 may respectively charge a plurality of the local word lines corresponding to the plurality of rows of storage units to a high electrical level by using a plurality of the global word lines and apply a voltage $V_{DD}$ to a slice select line #1 of the storage unit array #1, to conduct the plurality of local word lines. In this way, the plurality of rows of storage units in the storage unit array #1 are enabled. In this case, when a write voltage is applied between a bit line and a source line that are corresponding to the storage units in the column j in the storage unit array #1, corresponding data can be written into the storage units in the column j of the plurality of rows of charged storage units.

For example, as shown in FIG. 10, a transistor $M_{10}$ is connected to a global word line #0 of storage units in a row 1 in the storage unit array #1. A drain of the transistor $M_{10}$ is connected to a local word line #10 connected to the storage units in the row 1, a source of the transistor $M_{10}$ is connected to the global word line #0, and a gate of the transistor $M_{10}$ is connected to a slice select line #1. A transistor $M_{k0}$ is connected to a local word line #k0 of the storage units in the row 1 in a storage unit array #k. A drain of the transistor $M_{k0}$ is connected to the local word line #k0 of the row, a gate of the transistor $M_{k0}$ is connected to a slice select line #k, and a source of the transistor $M_{k0}$ is also connected to the global word line #0.

When data needs to be written into a storage unit array, a voltage is applied to a slice select line of the storage unit array. The slice select line #1 is used to gate (that is, enable or disable) the storage unit array #1. The global word line #0 controls all storage units in a row 1 from the storage unit array #1 to a storage unit array #k. When a voltage $V_{set}$ or $V_{reset}$ is applied to the slice select line #1, all transistors $M_{10}$, $M_{1i}$, . . . are connected to the global word line corresponding to each row in the storage unit array #1 are enabled. If a local word line #10 that enables the storage units in the row 1 in the storage unit array #1 to be connected in series has been charged by using the global word line #0, the storage units in the row 1 in the storage unit array #1 can be enabled. If a local word line #1i that enables storage units in a row i in the storage unit array #1 to be connected in series has been charged by using a global word line #i, the storage units in the row i in the storage unit array #1 can also be enabled. Data may be written into the enabled storage units by controlling the voltage between the bit line and the source line.

A slice select line #k is used to gate (that is, enable or disable) the storage unit array #k. The global word line #i controls all storage units in the row i from the storage unit array #1 to the storage unit array #k. When a voltage $V_{set}$ or $V_{reset}$ is applied to the slice select line #k, all transistors $M_{k0}$, . . . , $M_{ki}$, . . . are connected to the global word line corresponding to each row in the storage unit array #k are enabled. If a local word line #k0 that enables storage units in the row 1 in the storage unit array #k to be connected in series has been charged by using the global word line #0, the storage units in the row 1 in the storage unit array #k can be enabled. If a local word line #ki that enables storage units in a row i in the storage unit array #k to be connected in series has been charged by using a global word line #i, the storage units in the row i in the storage unit array #k can also be enabled. Data may be written into the enabled storage units by controlling the voltage between the bit line and the source line.

Figure 11:
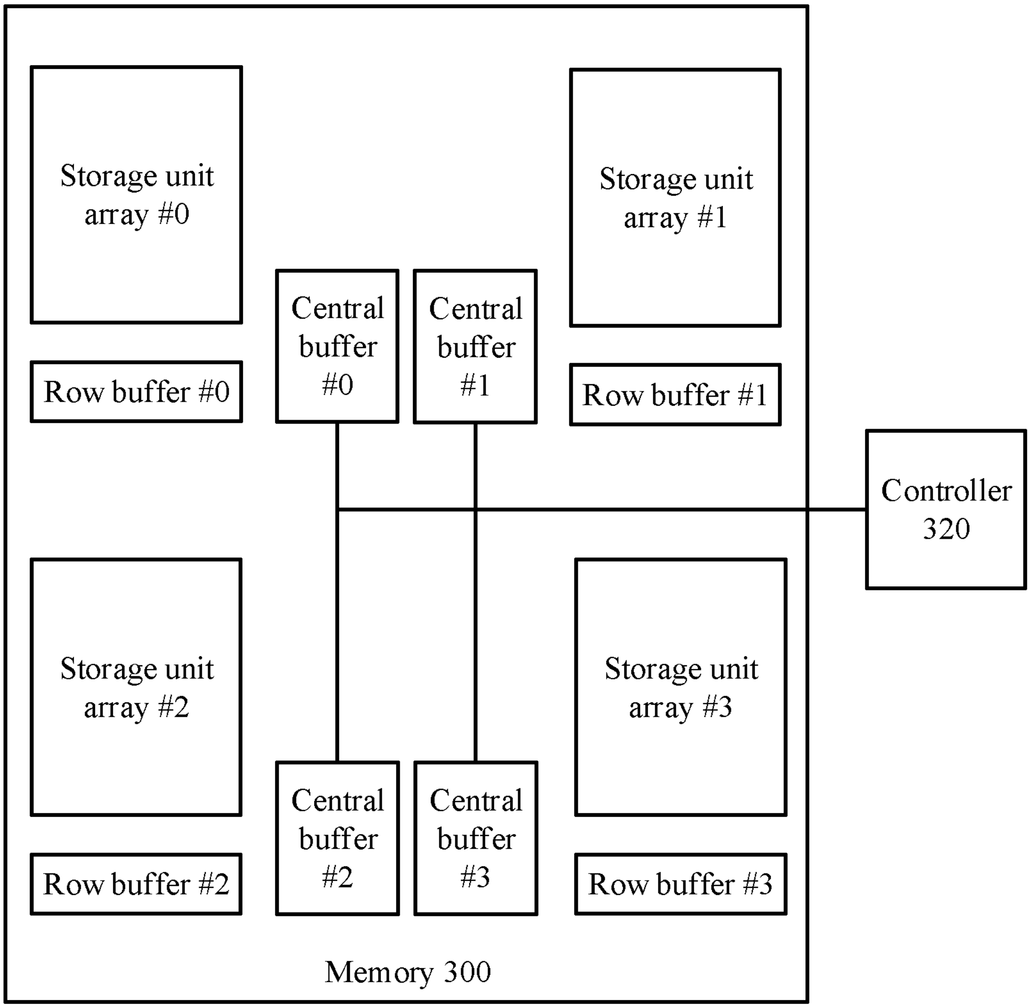
FIG. 11 is a schematic block diagram of a central buffer and a row buffer according to an embodiment of this application.

Optionally, the memory 300 may include a plurality of storage unit arrays. Each storage unit array may have a respective central buffer and a respective row buffer, to buffer M rows of data to be written into the storage units. For example, each storage unit array may be the storage unit array 310 in FIG. 5, or the storage unit arrays shown in FIG. 7 and FIG. 8. The controller 320 may perform the foregoing column-by-column write operation on the storage unit array. For example, FIG. 11 is a schematic block diagram of a central buffer and a row buffer, and shows four storage unit arrays included in the memory and the respective central buffers and the respective row buffers, where each storage unit array may include, for example, storage units in M rows and N column.

FIG. 12 is a schematic flowchart of a write data method according to an embodiment of this application. As shown in FIG. 12, the method is applied to a memory including a storage unit array and a controller connected to the storage unit array. The storage unit array includes storage units in M rows and N columns, M word lines, and N bit line pairs, and each of the N bit line pairs includes a bit line and a source line, where storage units in a row i in the storage unit array are connected to a word line i of the M word lines, storage units in a column j in the storage unit array are connected in parallel between a bit line j and a source line j in a bit line pair j of the N bit line pairs, both M and N are integers greater than or equal to 2, i is an integer greater than or equal to 0 and less than M, and j is an integer greater than or equal to 0 and less than N; and the method includes:

in 1210, obtaining, by the controller, Q rows of data, to be written into the storage unit array, of Q rows of storage units, where each of the Q rows of data includes P bits to be written into corresponding storage units, Q is a positive integer less than or equal to M, and P is a positive integer less than or equal to N;

in 1220, performing, by the controller, a reset operation on storage units in a column j in P columns of storage units, to write a first value into each of the storage units in the column j;

in 1230, determining, by the controller in the Q rows of data, to-be-written rows, where a bit j of the data of each of the to-be-written rows is a second value; and in 1240, writing, by the controller, in parallel the second value into storage units of the to-be-written rows in the storage units in the column j.

Optionally, the performing, by the controller, a reset operation on storage units in a column j in P columns of storage units, to write a first value into each of the storage units in the column j includes: applying, by the controller, a write voltage used to write the first value to one or more bit line pairs, and applying a turn-on voltage to the Q word lines to perform the reset operation, where the one or more bit line pairs include the bit line pair j; and the determining, by the controller, rows whose bit j in each of the Q rows of data is a second value as to-be-written rows and the writing, by the controller, in parallel the second value into storage units of the to-be-written rows in the storage units in the column j includes: applying, by the controller, a write voltage used to write the second value to the bit line pair j, and applying a turn-on voltage to word lines corresponding to the to-be-written rows, to write in parallel the second value into the storage units of the to-be-written rows.

Optionally, Q>P.

Optionally, the method further includes: buffering, by the central buffer, the Q rows of data to be written into the storage unit array; and the obtaining, by the controller, Q rows of data, to be written into the storage unit array, of Q rows of storage units includes: obtaining, by the controller, the Q rows of data from the central buffer.

A person of ordinary skill in the art may be aware that units and algorithm steps in the examples described with reference to the embodiments disclosed in this specification can be implemented by electrical hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

All or some of the foregoing embodiments may be implemented by means of software, hardware, firmware, or any combination thereof. When being implemented by using software, all or some of the embodiments may be implemented in a form of a computer program product. The computer program product includes one or more computer instructions. When the computer program instructions are loaded and executed on the computer, the procedure or functions according to the embodiments of the present invention are all or partially generated. The computer may be a general purpose computer, a dedicated computer, a computer network, or other programmable apparatuses. The computer instructions may be stored in a computer readable storage medium or may be transmitted from a computer readable storage medium to another computer readable storage medium. For example, the computer instructions may be transmitted from a website, computer, server, or data center to another website, computer, server, or data center in a wired (for example, a coaxial cable, or an optical fiber) or wireless (for example, infrared, radio, or microwave) manner. The computer readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, an optical disk), a semiconductor medium (for example, a solid state disk (SSD)), or the like.

What is claimed is:

1. A memory device, comprising:

a storage unit array containing storage units arranged into M rows and N columns; and a controller connected to the storage unit array and configured to perform operations of:

obtaining Q rows of data to be written into Q rows of storage units of the storage unit array, wherein each of the Q rows of data comprises P bits to be written into corresponding storage units, Q is less than or equal to M, and P is less than or equal to N;

performing a reset operation on storage units in a column j in P columns of storage units to write a first value into each of the storage units in the column j, wherein j is less than P;

determining to-be-written rows in the Q rows of data, wherein a bit j of data of each of the to-be-written rows is a second value; and after the reset operation is performed, writing in parallel the second value into storage units of the to-be-written rows in the storage units in the column j.

2. The memory device according to claim 1, wherein Q is greater than P.

3. The memory device according to claim 1, further comprising:

a central buffer configured for buffering the Q rows of data to be written into the storage unit array, wherein the controller is configured to obtain the Q rows of data from the central buffer.

4. The memory device according to claim 1, wherein the storage units of the storage unit array are resistive random access memory (RRAM) units, magnetic random access memory (MRAM) units, or spin-transfer torque magnetic random access memory (STT MRAM) units.

5. The memory device according to claim 1, wherein the storage unit array further comprises M word lines, and N bit line pairs, wherein each of the N bit line pairs comprises a bit line and a source line, wherein storage units in a row i in the storage unit array are connected to a word line i of the M word lines, storage units in a column j in the storage unit array are connected in parallel between a bit line and a source line in a bit line pair j of the N bit line pairs, and wherein i is less than M.

6. The memory device according to claim 5, wherein the controller is further configured to perform operations of:

applying a write voltage used to write the first value to one or more bit line pairs, and applying a turn-on voltage to Q word lines of the M word lines to perform the reset operation, wherein the one or more bit line pairs comprise the bit line pair j; and applying a write voltage used to write the second value to the bit line pair j, and applying a turn-on voltage to word lines corresponding to the to-be-written rows, to write in parallel the second value into the storage units of the to-be-written rows.

7. A method for writing data performed by a controller of a memory device having a storage unit array including Q rows and P columns of storage units, the method comprising:

obtaining Q rows of data to be written into the Q rows of storage units, wherein each of the Q rows of data comprises P bits to be written into corresponding storage units;

performing a reset operation on storage units in a column j in P columns of storage units to write a first value into each of the storage units in the column j, wherein j is less than P;

determining to-be-written rows in the Q rows of data, wherein a bit j of the data of each of the to-be-written rows is a second value; and after the reset operation is performed, writing in parallel the second value into storage units of the to-be-written rows in the storage units in the column j.

8. The method according to claim 7, wherein the storage unit array further comprises Q word lines and P bit line pairs, each of the P bit line pairs comprises a bit line and a source line, storage units in a row i in the first storage unit array are connected to a word line i of the Q word lines, storage units in a column j in the first storage unit array are connected in parallel between a bit line and a source line in a bit line pair j of the P bit line pairs, wherein i is less than Q;

wherein the operation of performing the reset operation on storage units in a column j comprises:

applying a write voltage used to write the first value to one or more bit line pairs in the P bit line pairs, and applying a turn-on voltage to the Q word lines to perform the reset operation, wherein the one or more bit line pairs comprise the bit line pair j; and wherein the writing in parallel the second value into storage units of the to-be-written rows in the storage units in the column j comprises:

applying a write voltage used to write the second value to the bit line pair j, and applying a turn-on voltage to word lines corresponding to the to-be-written rows, to write in parallel the second value into the storage units of the to-be-written rows.

9. The method according to claim 7, wherein Q is greater than P.

10. The method according to claim 7, wherein the operation of obtaining the Q rows of data comprises obtaining the Q rows of data from a central buffer buffering the Q rows of data to be written into the storage unit array.

11. A computer system, comprising:

a processor, a memory connected to the processor, comprising:

a first storage unit array comprising storage units in Q rows and P columns;

a controller connected to the first storage unit array and configured to perform operations of:

obtaining Q rows of data to be written into Q rows of storage units of the first storage unit array, wherein each of the Q rows of data comprises P bits to be written into corresponding storage units;

performing a reset operation on storage units in a column j in the P columns of storage units, to write a first value into each of the storage units in the column j, wherein j is less than P;

determining to-be-written rows in the Q rows of data, wherein a bit j of data of each of the to-be-written rows is a second value; and after the reset operation is performed, writing in parallel the second value into storage units of the to-be-written rows in the storage units in the column j.

12. The computer system according to claim 11, wherein Q is greater than P.

13. The computer system according to claim 11, further comprising:

a central buffer configured for buffering the Q rows of data to be written into the first storage unit array, wherein the controller is configured to obtain the Q rows of data from the central buffer.

14. The computer system according to claim 11, wherein the storage units in the first storage unit array are resistive random access memory (RRAM) units, magnetic random access memory (MRAM) units, or spin-transfer torque magnetic random access memory (STT MRAM) units.

15. The computer system according to claim 11, wherein the first storage unit array further comprises Q word lines and P bit line pairs, each of the P bit line pairs comprises a bit line and a source line, storage units in a row i in the first storage unit array are connected to a word line i of the Q word lines, storage units in a column j in the first storage unit array are connected in parallel between a bit line and a source line in a bit line pair j of the P bit line pairs, wherein i is less than Q.

16. The computer system according to claim 15, wherein the controller is configured to perform operations of:

applying a write voltage used to write the first value to one or more bit line pairs of the P bit line pairs, and applying a turn-on voltage to the Q word lines to perform the reset operation, wherein the one or more bit line pairs comprise a bit line pair j;

applying a write voltage used to write the second value to the bit line pair j, and applying a turn-on voltage to word lines corresponding to the to-be-written rows, to write in parallel the second value into the storage units of the to-be-written rows.

17. The computer system according to claim 11, further comprising:

a second storage unit array comprising storage units in Q rows and P columns;

wherein the controller is further configured to select the first storage unit array or the second storage unit array through a slice select line connected to the first storage unit array and the second storage unit array.

* * * * *

UNITED STATES PATENT AND TRADEMARK OFFICE

CERTIFICATE OF CORRECTION

PATENT NO. : 11,289,159 B2
APPLICATION NO. : 16/720406
DATED : March 29, 2022
INVENTOR(S) : Longnos et al.

It is certified that error appears in the above-identified patent and that said Letters Patent is hereby corrected as shown below:

On the Title Page

Page 2: Other Publications, Column 2, Line 50: "tions", Spintronics-based Computing, Springer, 2015, total 145" should read -- tions", Spintronics-based Computing, Springer, 2015, total 13 --.

Signed and Sealed this
Ninth Day of August, 2022

Katherine Kelly Vidal

Katherine Kelly Vidal
*Director of the United States Patent and Trademark Office*